(12) United States Patent
Flachowsky et al.

(10) Patent No.: US 9,490,344 B2
(45) Date of Patent: Nov. 8, 2016

(54) METHODS OF MAKING TRANSISTOR DEVICES WITH ELEVATED SOURCE/DRAIN REGIONS TO ACCOMMODATE CONSUMPTION DURING METAL SILICIDE FORMATION PROCESS

(75) Inventors: Stefan Flachowsky, Dresden (DE); Jan Hoentschel, Dresden (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 735 days.

(21) Appl. No.: 13/345,922

(22) Filed: Jan. 9, 2012

(65) Prior Publication Data

US 2013/0178034 A1    Jul. 11, 2013

(51) Int. Cl.
| | | |
|---|---|---|
| *H01L 21/02* | (2006.01) | |
| *H01L 21/334* | (2006.01) | |
| *H01L 21/336* | (2006.01) | |
| *H01L 29/66* | (2006.01) | |
| *H01L 29/78* | (2006.01) | |

(52) U.S. Cl.
CPC ... *H01L 29/66628* (2013.01); *H01L 29/66636* (2013.01); *H01L 29/7834* (2013.01); *H01L 29/7847* (2013.01); *H01L 29/7848* (2013.01); *H01L 29/6659* (2013.01)

(58) Field of Classification Search
CPC .................................................. H01L 29/66628
USPC ......................................................... 438/300
See application file for complete search history.

(56) References Cited

U.S. PATENT DOCUMENTS

| | | |
|---|---|---|
| 4,929,992 A | 5/1990 | Thomas et al. |
| 5,200,349 A | 4/1993 | Yokoyama |
| 6,051,851 A | 4/2000 | Ohmi et al. |
| 6,329,720 B1 | 12/2001 | Li et al. |
| 6,716,708 B2 | 4/2004 | Cabral, Jr. et al. |
| 7,615,831 B2 | 11/2009 | Zhu et al. |
| 8,124,483 B2 | 2/2012 | Schulz |
| 2001/0028087 A1* | 10/2001 | Hirashita ............... H01L 29/458 257/344 |
| 2005/0035409 A1* | 2/2005 | Ko et al. ......................... 257/350 |
| 2005/0176204 A1* | 8/2005 | Langdo et al. ................ 438/298 |
| 2006/0003533 A1* | 1/2006 | Kammler et al. ............. 438/300 |
| 2007/0018252 A1* | 1/2007 | Zhu ................................ 257/369 |
| 2013/0153970 A1* | 6/2013 | Eisele ...................... H01L 21/02 257/254 |

* cited by examiner

*Primary Examiner* — Moazzam Hossain
(74) *Attorney, Agent, or Firm* — Amerson Law Firm, PLLC (57) ABSTRACT

Disclosed herein are various semiconductor devices with dual metal silicide regions and to various methods of making such devices. One illustrative method disclosed herein includes the steps of forming an upper portion of a source/drain region that is positioned above a surface of a semi-conducting substrate, wherein the upper portion of the source/drain region has an upper surface that is positioned above the surface of the substrate by a distance that is at least equal to a target thickness of a metal silicide region to be formed in the upper portion of the source/drain region and forming the metal silicide region in the upper portion of the source/drain region.

16 Claims, 7 Drawing Sheets

METHODS OF MAKING TRANSISTOR DEVICES WITH ELEVATED SOURCE/DRAIN REGIONS TO ACCOMMODATE CONSUMPTION DURING METAL SILICIDE FORMATION PROCESS

BACKGROUND OF THE INVENTION

1. Field of the Invention

Generally, the present disclosure generally relates to the manufacturing of sophisticated semiconductor devices, and, more specifically, to various methods of making transistor devices with elevated source/drain regions to accommodate consumption of silicon during metal silicide formation process.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Device designers are under constant pressure to increase the operating speed and electrical performance of transistors and integrated circuit products that employ such transistors. Given that the gate length (the distance between the source and drain regions) on modern transistor devices may be approximately 30-50 nm, and that further scaling is anticipated in the future, device designers have employed a variety of techniques in an effort to improve device performance, e.g., the use of high-k dielectrics, the use metal gate electrode structures, the incorporation of work function metals in the gate electrode structure and the use of channel stress engineering techniques on transistors (create a tensile stress in the channel region for NMOS transistors and create a compressive stress in the channel region for PMOS transistors). Stress engineering techniques typically involve the formation of specifically made silicon nitride layers that are selectively formed above appropriate transistors, i.e., a layer of silicon nitride that is intended to impart a tensile stress in the channel region of a NMOS transistor would only be formed above the NMOS transistors. Such selective formation may be accomplished by masking the PMOS transistors and then blanket depositing the layer of silicon nitride, or by initially blanket depositing the layer of silicon nitride across the entire substrate and then performing an etching process to selectively remove the silicon nitride from above the PMOS transistors. Conversely, for PMOS transistors, a layer of silicon nitride that is intended to impart a compressive stress in the channel region of a PMOS transistor is formed above the PMOS transistors. The techniques employed in forming such nitride layers with the desired tensile or compressive stress are well known to those skilled in the art. Since the stress-inducing layers are removed from the final device, the stress in the final device is believed to be a "memorized" or residual stress that present in the gate electrode and/or the source/drain regions of the device.

In a field effect transistor, metal silicide regions are typically formed in the source/drain regions of a transistor to reduce the resistance when a conductive contact is formed to establish electrical connection to the source/drain regions. The metal silicide regions are typically formed after a desired stress level has been established for a transistor using the aforementioned stress-inducing silicon nitride layers. Such metal silicide regions may be made using a variety of different refractory metals, e.g., nickel, platinum, cobalt, etc., and they may be formed using techniques that are well known to those skilled in the art. The typical steps performed to form metal silicide regions are: (1) depositing a layer of refractory metal on an exposed surface of a silicon-containing material, such as exposed source/drain regions; (2) performing an initial heating process that causes the refractory metal to react with underlying silicon-containing material; (3) performing an etching process to remove unreacted portions of the layer of refractory metal and (4) performing an additional heating process to form the final phase of the metal silicide.

The formation of metal silicide regions on source/drain regions consumes some of the silicon material—some of the stressed source/drain material near the surface of the substrate. For example, forming a metal silicide region having a final thickness of about 30 nm, consumes about 25 nm of the underlying silicon material. Removal of the stressed source/drain material eliminates some of the desired stress established for the transistor. This is particularly problematic because the silicidation process consumes portions of the source/drain region that are near the level of the conductive channel region that will be established under the gate insulation layer when the transistor is "turned on."

The present disclosure is directed to various methods of forming source/drain regions that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of making transistor devices with elevated source/drain regions to accommodate consumption of silicon during metal silicide formation process. One illustrative method disclosed herein includes the steps of forming an upper portion of a source/drain region that is positioned above a surface of a semiconducting substrate, wherein the upper portion of the source/drain region has an upper surface that is positioned above the surface of the substrate by a distance that is at least equal to a target thickness of a metal silicide region to be formed in the upper portion of the source/drain region and forming the metal silicide region in the upper portion of the source/drain region.

In another illustrative example, a method disclosed herein includes the steps of forming an extension implant region and a source/drain implant region in a semiconducting substrate proximate a gate structure of a transistor, after forming the extension implant region and the source/drain implant region, performing an epitaxial deposition process to form a semiconductor material positioned above the source/drain implant region and a surface of the semiconducting substrate, wherein the semiconductor material has an upper surface that is positioned above the surface of the substrate by a distance that is at least equal to a target thickness of a metal silicide region to be formed in the semiconductor material and forming the metal silicide region in the semiconductor material.

In yet another illustrative example, a method disclosed herein includes the steps of forming an extension implant region in a semiconducting substrate proximate a gate structure of said transistor, performing an epitaxial deposition process to form an undoped semiconductor material positioned above the extension implant region and a surface of the semiconducting substrate, wherein the undoped semiconductor material has an upper surface that is positioned above the surface of the substrate by a distance that is at least equal to a target thickness of a metal silicide region to be formed on said source/drain regions, and performing an ion implantation process to introduce a dopant into the undoped semiconductor material and to form a source/drain implant region in the substrate. The method also includes the steps of performing an activation anneal process to activate dopant materials in at least the extension implant region and the source/drain implant region and forming the metal silicide region in the semiconductor material.

In yet another illustrative example, a method disclosed herein includes the steps of forming an extension implant region and a source/drain implant region in a semiconducting substrate proximate a gate structure of a transistor, performing a first activation anneal process to activate dopant materials in the extension implant region and the source/drain implant region, after performing the first activation anneal process, performing an epitaxial deposition process to form a doped semiconductor material positioned above the source/drain implant region and a surface of the semiconducting substrate, wherein the semiconductor material has an upper surface that is positioned above the surface of the substrate by a distance that is at least equal to a target thickness of a metal silicide region to be formed in said doped semiconductor material and forming the metal silicide region in the doped semiconductor material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of making transistor devices with elevated source/drain regions to accommodate consumption of silicon during metal silicide formation process while reducing or perhaps eliminating at least some of the problems discussed in the background section of this application. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, ASICs, logic devices, memory devices, etc. With reference to the attached figures, various illustrative embodiments of the methods and devices disclosed herein will now be described in more detail.

Figure 1A:
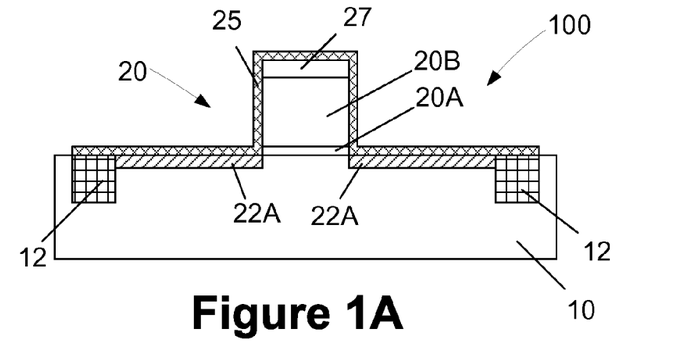
FIGS. 1A-1F depict various illustrative methods of making transistor devices with elevated source/drain regions as disclosed herein.

FIG. 1A is a simplified view of an illustrative transistor 100 at an early stage of manufacturing. The transistor 100 may be either an NMOS transistor or a PMOS transistor 100P. The transistor 100 is formed in and above an active region of a semiconducting substrate 10 that is defined by an illustrative trench isolation structure 12 formed in the substrate 10. The substrate 10 may have a variety of configurations, such the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon.

At the point of fabrication depicted in FIG. 1A, the transistor 100 includes a schematically depicted gate electrode structure 20 that typically includes an illustrative gate insulation layer 20A and an illustrative gate electrode 20B. The gate insulation layer 20A may be comprised of a variety of different materials, such as, for example, silicon dioxide, a so-called high-k (k greater than 10) insulation material, etc. Similarly, the gate electrode 20B may also be of a material such as polysilicon or amorphous silicon, or it may be comprised of one or more metal layers that act as the gate electrode 20B. As will be recognized by those skilled in the art after a complete reading of the present application, the gate electrode structure 20 of the transistor 100 depicted in the drawings, i.e., the gate insulation layer 20A and the gate electrode 20B, is intended to be representative in nature. That is, the gate electrode structure 20 may be comprised of a variety of different materials and it may have a variety of configurations, and the gate electrode structure 20 may be made using either so-called "gate-first" or "gate-last" techniques. For ease of explanation, the illustrative transistor 100 will be depicted as having a polysilicon gate electrode 20B, however, the present invention should not be considered as limited to such an illustrative embodiment.

With continuing reference to FIG. 1A, the transistor 100 also includes a liner layer 25, a gate cap layer 27, e.g., silicon nitride, and so-called extension implant regions 22A. The extension implant regions 22A are formed in the substrate 10 performing an ion implantation process through a photoresist mask (not shown), i.e., by implanting an N-type dopant for an NMOS transistor or by implanting a P-type dopant for a PMOS transistor. Although not depicted in the drawings, at the point of fabrication depicted in FIG. 1A, so-called halo implant regions (not shown) have been formed in the substrate 10 typically by performing an angled ion implant process (with a P-type dopant for an NMOS transistor and with a N-type dopant for a PMOS transistor). The various structures and regions of the transistors 100 depicted in FIG. 1A may be formed by performing well known processes. For example, the gate structure 20 may be formed by depositing various layers of material and thereafter performing one or more etching processed to define the basic layer stack of the gate electrode structure 20. The liner layer 25 may be comprised a relatively thin, e.g., 2-3 nm, layer of, for example, silicon dioxide, that is formed by performing a conformal chemical vapor deposition (CVD) process.

Figure 1B:
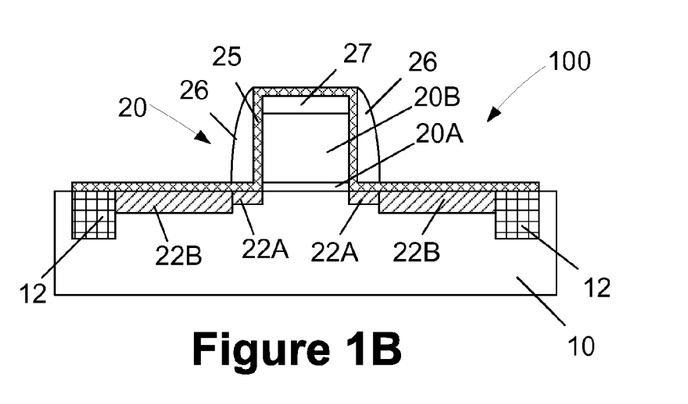

Next, as shown in FIG. 1B, a sidewall spacer 26 is formed proximate the gate structure 20 and so-called source-drain implant regions 22B are formed in the substrate 10. The sidewall spacer 26 may be formed by depositing a layer of spacer material, such as silicon nitride, and thereafter performing an anisotropic etching process on the layer of spacer material. The source/drain implant regions 22B are formed in the substrate 10 by performing an ion implantation process through a photoresist mask (not shown), i.e., by implanting an N-type dopant for an NMOS transistor and by implanting a P-type dopant for a PMOS transistor. The extension implant regions 22A typically have a lower dose of ions than does the source/drain implant regions 22B.

Figure 1C:
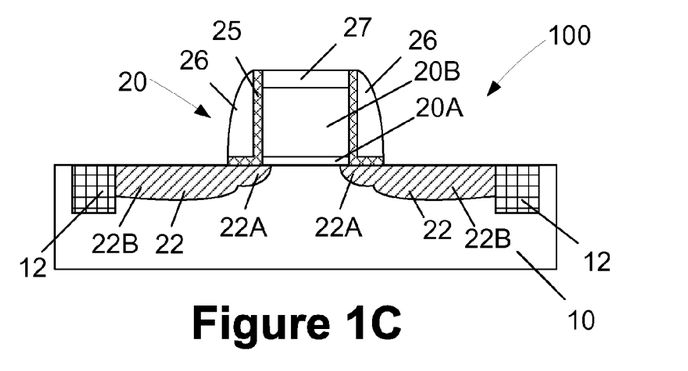

Then, as shown in FIG. 1C, an activation anneal process (e.g., a flash or laser anneal performed at about 1200° C. for about 1-2 ms) is performed to repair damage to the substrate 10 due to the various ion implantation processes and to activate the implanted dopant material. The source/drain regions 22 depicted in FIG. 1C are shown after the activation anneal process has been performed and the extension implant regions 22A and the source/drain implant regions 22B have migrated from their as-implanted positions. Also, an etching process has been performed to remove exposed portions of the liner layer 25.

Figure 1D:
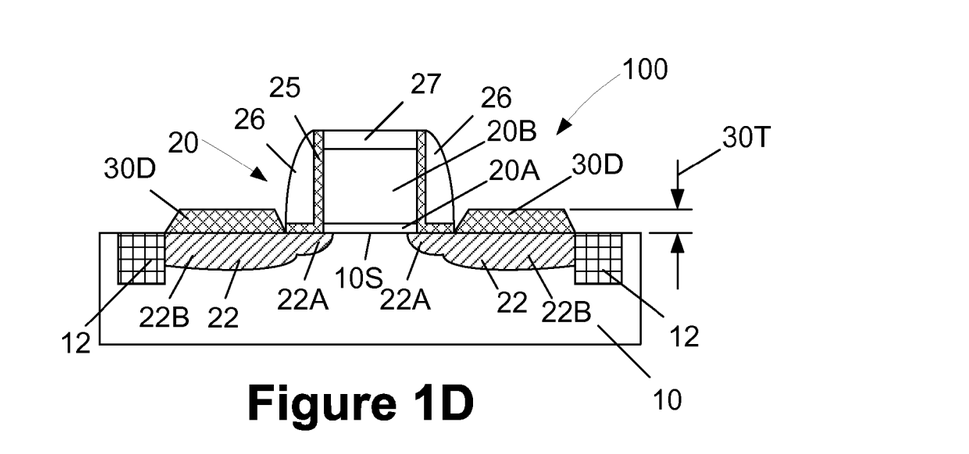

Next, as shown in FIG. 1D, an epitaxial deposition process is performed to grow a doped semiconductor material 30D on the source/drain regions 22. This doped semiconductor material 30D will constitute an upper portion of the final source/drain regions 50 (see FIG. 1F) of the transistor 100. Although depicted with different shading to facilitate explanation of the present inventions, the doped semiconductor material 30D will eventually become a part of the final source/drain regions 50 (see FIG. 1F) for the transistor 100. The doped semiconductor material 30 may be comprised of a variety of different materials, e.g., doped silicon germanium, doped silicon carbon, etc. The doped semiconductor material 30D may be formed by introducing the appropriate dopant (N-type dopant for an NMOS transistor or a P-type dopant for a PMOS transistor) in situ during the epitaxial deposition process. Importantly, the thickness 30T of the doped semiconductor material 30D is specifically selected to be at least as thick as the target thickness of the metal silicide region (see FIG. 1F) that will be formed on the final source/drain regions 50 of the transistor 100. Stated another way, the upper surface of the doped semiconductor material 30D extends above the surface 10S of the substrate 10 by a distance that is at least equal to the target thickness of the metal silicide region 34A. For example, if the metal silicide region 34A that is to be formed on the final source/drain regions 50 of the transistor 100 will have a target thickness of about 25 nm, then the thickness of the doped semiconductor material 30D may have a thickness of about 30 nm. In some cases, the epitaxial deposition process may be performed at a temperature of about 600° C. Since the doped semiconductor material 30D was formed after the initial anneal process was performed to activate the implanted dopant materials, a subsequent activation anneal (e.g., a flash or laser anneal performed at about 1200° C. for about 1-2 ms) may be performed after the doped semiconductor material 30D is formed to reactivate the implanted dopant material.

Figure 1E:
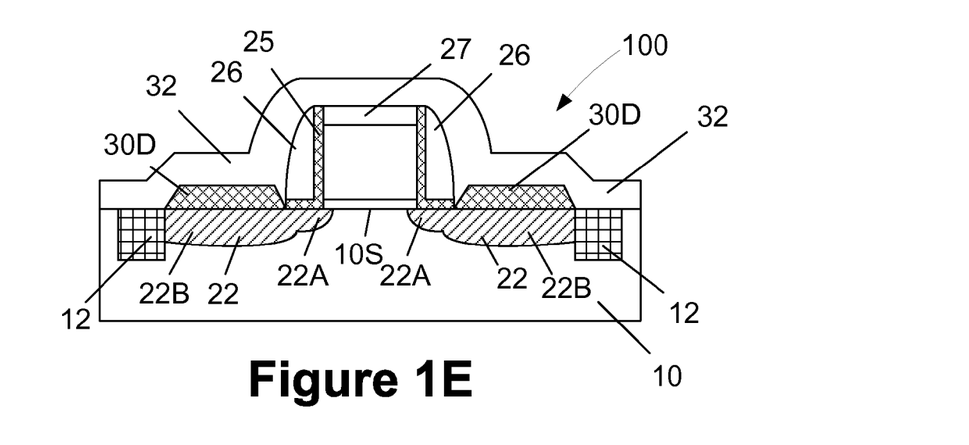

Next, as shown in FIG. 1E stress-inducing layer 32 is formed above the transistor 100. The stress-inducing layer 32 may be comprised of a material such as silicon nitride, it may have a thickness of about 50-60 nm, and it may be formed using a CVD process wherein the parameters of the CVD process are adjusted and controlled such that the stress-inducing layer 32 exhibits the desired stress—a tensile stress for a NMOS transistor or a compressive stress for a PMOS transistor. The manner in which such stress-inducing layers 32 are formed are well known to those skilled in the art. After the stress-inducing layer 32 is formed, a spike anneal process (e.g., 1000-1100° C. for a duration of about 2 seconds) is performed to as the activation anneal to heal implant damage and to activate the implanted dopant material. In the case where the stress-inducing layers 32 are used, this anneal also acts as the "stress-memorization" anneal.

Figure 1F:
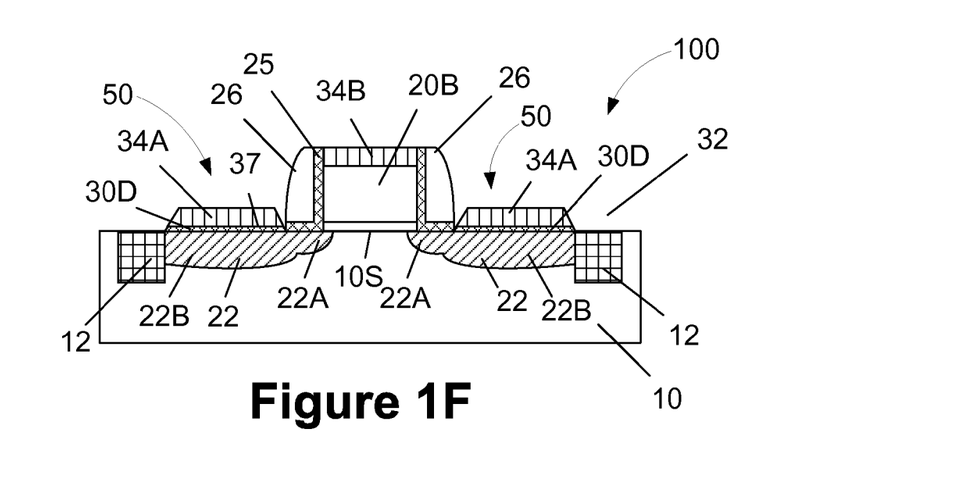

FIG. 1F depicts the transistor 100 after several steps have been performed. First, an etching process has been performed to remove the stress-inducing layer 32. Then, the gate cap layer 27 has been removed to expose the gate electrode 20B. A silicidation process is then performed to form metal silicide regions 34A on the final source/drain regions 50 of the transistor 100 and a metal silicide region 34 B on the gate electrode 20B. In the case where the gate electrode 20B is a metal layer, the metal silicide region 34B would not be formed. The depth or thickness of the metal silicide regions 34A, 34B may also vary depending upon the particular application, e.g., 15-25 nm. The metal silicide regions 34A, 34B may be made of the same or different metal silicides, and they may be formed at different times. The metal silicide regions 34A, 34B may be formed by performing traditional silicidation processes, i.e., depositing a layer of refractory metal, performing a heating process causing the refractory metal to react with underlying silicon containing material, removing unreacted portions of the layer of refractory metal (e.g., nickel, platinum, or combinations thereof), followed perhaps by performing an additional heating process. In one illustrative example, the metal silicide regions 34A, 34B are both comprised of nickel-platinum silicide, they are both formed at the same time and they both have a thickness that ranges from 15-25 nm. As shown in the depicted example, the metal silicide regions 34A consume less than the entirety of the doped semiconductor material 30D that was formed on the source/drain regions 22 depicted in FIG. 1C. Accordingly, by use of the present invention, the stressed material in the final source/drain regions 50 of the transistor 100 proximate the channel region of the transistor 100 is not consumed during the silicidation process performed to form the metal silicide regions 34A.

Figure 2A:
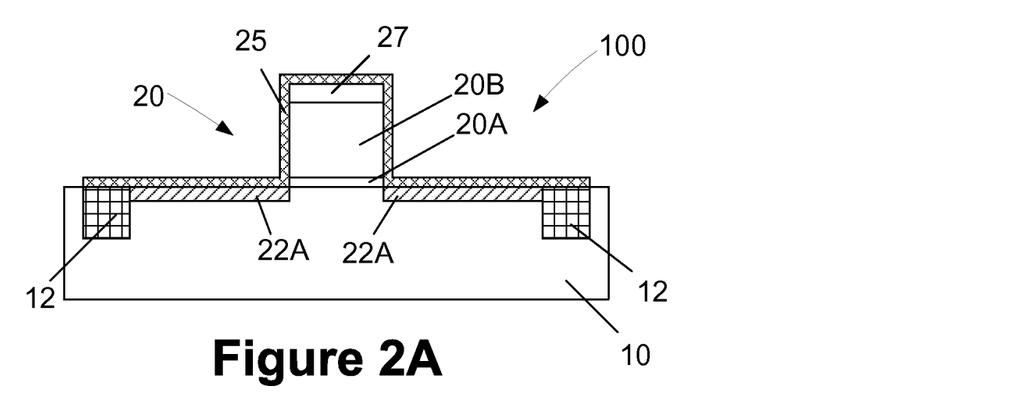
FIGS. 2A-2E depict various other methods of forming transistor devices with elevated source/drain regions as disclosed herein.

FIGS. 2A-2E depict another illustrative method disclosed herein that also involves the formation of elevated source/drain regions for the transistor 100. FIG. 2A depicts the transistor 100 at the same stage of fabrication as depicted in FIG. 1A. That is, the basic gate structure 20, the gate cap layer 27, the liner layer 25, the extension implant regions 22A and halo implant regions (not shown) have been formed.

Figure 2B:
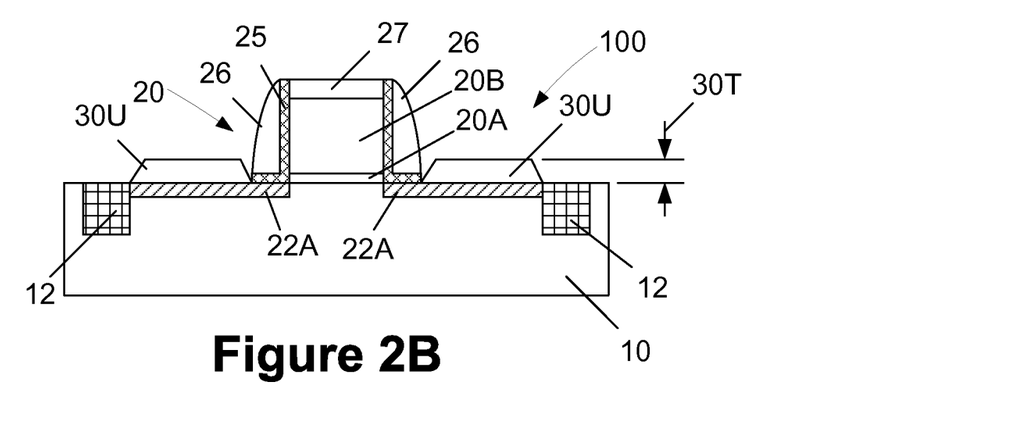

Next, as shown in FIG. 2B, the sidewall spacer 26 has been formed proximate the gate structure 20 and exposed portions of the liner layer 25 have been removed. Thereafter, an epitaxial deposition process is performed to grow an undoped semiconductor material 30U on the substrate 10 above the extension implant regions 22A. The undoped semiconductor material 30U is not shaded at this point to reflect that it does not contain any dopant material (N-type dopant for an NMOS transistor or a P-type dopant for a PMOS transistor) at this point in the process. Eventually, the undoped semiconductor material 30U will become a part of the final source/drain regions 50 (see FIG. 2E) of the transistor 100. That is, this undoped semiconductor material 30U will constitute an upper portion of the final source/drain regions 50 (see FIG. 2E) of the transistor 100. The undoped semiconductor material 30U may be made of the same materials as that described previously for the doped semiconductor material 30D. Importantly, the thickness 30T of the undoped semiconductor material 30U is specifically selected to be at least as thick as the target thickness of the metal silicide region 34A (see FIG. 2E) that will be formed on the final source/drain regions 50 of the transistor 100. Stated another way, the upper surface of the undoped semiconductor material 30U extends above the surface 10S of the substrate 10 by a distance that is at least equal to the target thickness of the metal silicide region 34A.

Figure 2C:
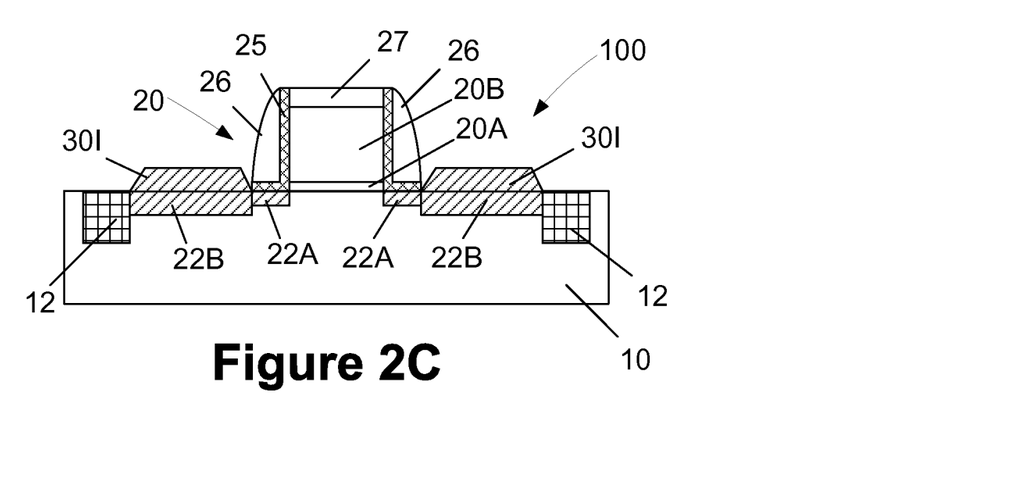

Next, as shown in FIG. 2C, an ion implantation process is performed to introduce the appropriate dopant (N-type dopant for an NMOS transistor or a P-type dopant for a PMOS transistor) into the undoped semiconductor material 30U and to form source/drain implant regions 22B in the substrate 10. In FIG. 2C, shading has been added to reflect the doping (by implantation) of the previously undoped semiconductor region 30U and a new reference number 30I has been added to reflect that an implant-doped semiconductor material 30I is now present on the transistor 100.

Figure 2D:
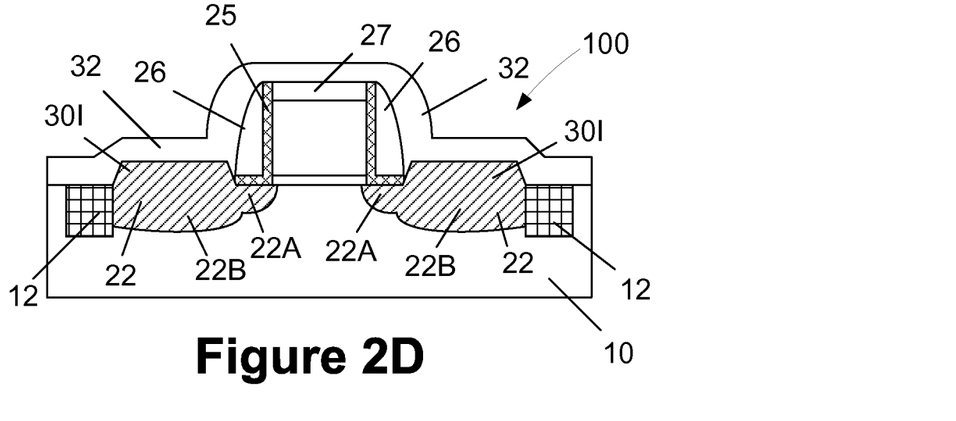

Then, as shown in FIG. 2D, an activation anneal process (e.g., a flash or laser anneal performed at about 1200° C. for about 1-2 ms) is performed to repair damage to the substrate 10 due to the various ion implantation processes and to activate the implanted dopant materials. The final source/drain regions 50 of the transistor 100 depicted in FIG. 2D are shown after the activation anneal process has been performed and the extension implant regions 22A and the source/drain implant regions 22B have migrated from their as-implanted positions. Since the undoped semiconductor material 30U was formed before the initial activation anneal process was performed to activate the implanted dopant materials, an additional activation anneal process is not required for this particular method. Then, the previously described stress-inducing layer 32 is formed above the transistor 100 to induce the desired stress in the transistor 100. After the stress-inducing layer 32 is formed, a spike anneal process (e.g., 1000-1100° C. for a duration of about 2 seconds) is performed.

Figure 2E:
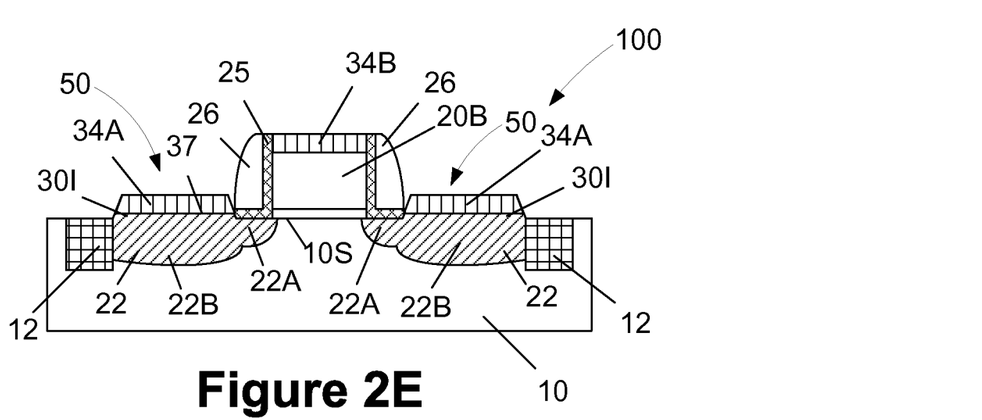

Next, as shown in FIG. 2F, the stress-inducing layer 32 and the gate cap layer 27 have been removed and a silicidation process has been performed to form the metal silicide regions 34A on the final source/drain regions 50 of the transistor 100 and to form the metal silicide region 34 B on the gate electrode 20B. As shown in the depicted example, the metal silicide regions 34A consume less than the entirety of the implant-doped semiconductor material 30I that was formed on the substrate 10, as shown in FIG. 2C. Accordingly, by use of the present invention, the stressed material in final source/drain regions 50 of the transistor 100 proximate the channel region of the transistor 100 is not consumed during the silicidation process performed to form the metal silicide regions 34A.

Figure 3A:
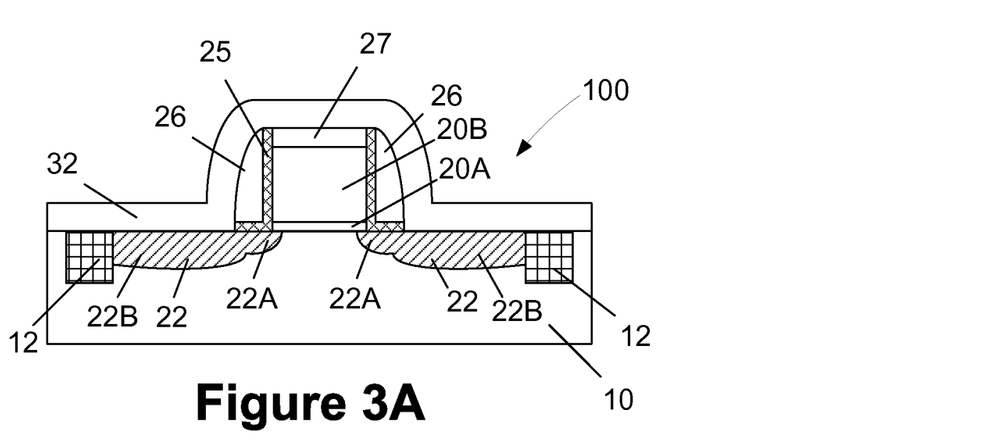
FIGS. 3A-3C depict yet other illustrative methods disclosed herein of forming transistor devices with elevated source/drain regions as disclosed herein.
Figure 3B:
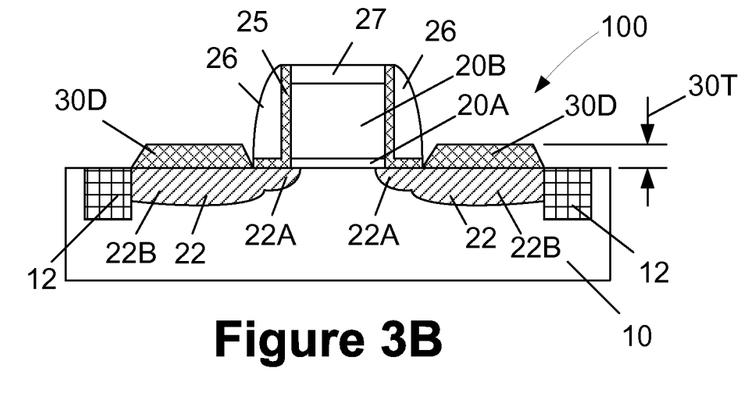
Figure 3C:
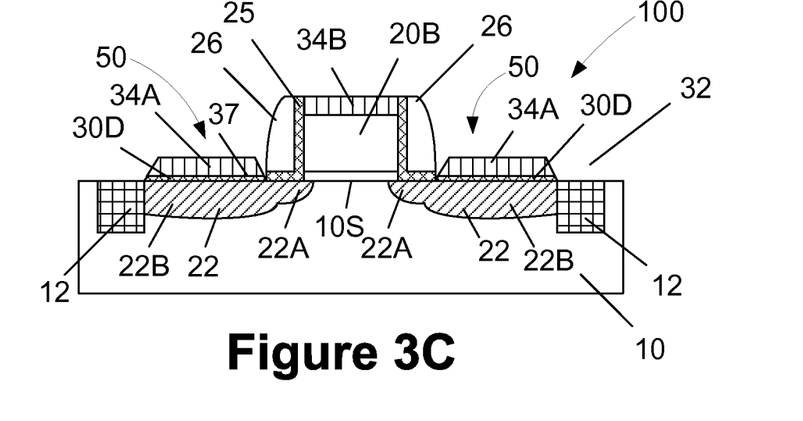

FIGS. 3A-3C depict yet another illustrative method disclosed herein that involves the formation of elevated source/drain regions for the transistor 100. FIG. 3A depicts the transistor 100 at the same stage of fabrication as depicted in FIG. 1C. That is, the basic gate structure 20, the liner layer 25, the extension implant regions 22A, halo implant regions (not shown), and the source/drain implant regions 22B have been formed, and an anneal process has been performed to activate the implanted dopants thereby resulting in the source/drain regions 22 shown in FIG. 3A. Then, the previously described stress-inducing layer 32 is formed above the transistor 100 to induce the desired stress in the transistor 100. After the stress-inducing layer 32 is formed, a spike anneal process (e.g., 1000-1100° C. for a duration of about 2 seconds) is performed.

Next, as shown in FIG. 3B, the stress inducing layer 32 has been removed and an epitaxial deposition process has been performed to grow the previously described doped semiconductor material 30D on the substrate 10. As noted previously, the doped semiconductor material 30D may be formed by introducing the appropriate dopant (N-type dopant for an NMOS transistor or a P-type dopant for a PMOS transistor) in situ during the epitaxial deposition process. Importantly, the thickness 30T of the doped semiconductor material 30D is specifically selected to be at least as thick as the target thickness of the metal silicide region 34A (see FIG. 3C) that will be formed on the final source/drain regions 50 of the transistor 100. Stated another way, the upper surface of the doped semiconductor material 30D extends above the surface 10S of the substrate 10 by a distance that is at least equal to the target thickness of the metal silicide region 34A.

Next, as shown in FIG. 3C, the gate cap layer 27 is removed and a silicidation process is performed to form the metal silicide regions 34A on the final source/drain regions 50 of the transistor 100 and to form the metal silicide region 34 B on the gate electrode 20B. Since the doped semiconductor material 30D was formed after the initial activation anneal process was performed to activate the implanted dopant materials, a subsequent activation anneal (e.g., a flash or laser anneal performed at about 1200° C. for about 1-2 ms) may be performed after the doped semiconductor material 30D is formed to reactivate the implanted dopant materials. As shown in the depicted example, the metal silicide regions 34A consume less than the entirety of the doped semiconductor material 30D that was formed on the substrate 10, as shown in FIG. 3B. Accordingly, by use of the present invention, the stressed material in final source/drain regions 50 of the transistor 100 proximate the channel region of the transistor 100 is not consumed during the silicidation process performed to form the metal silicide regions 34A.

Figure 4A:
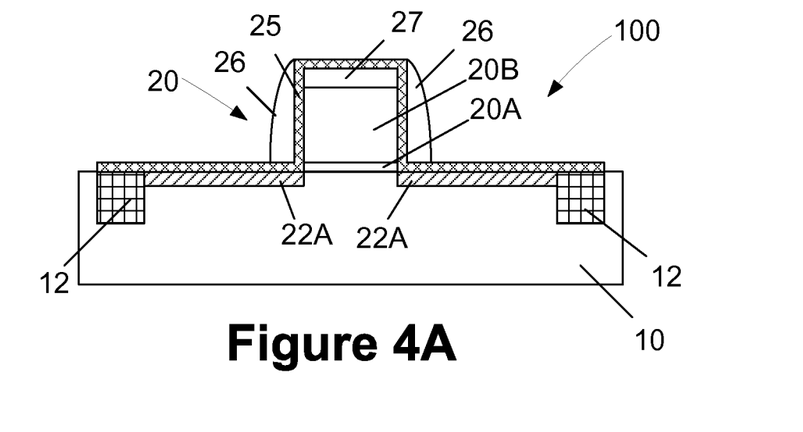
FIGS. 4A-4G depict various other methods of forming transistor devices with elevated source/drain regions that involves forming cavities in a substrate as part of the process.

FIGS. 4A-4G depict yet another illustrative method disclosed herein that involves the formation of elevated source/drain regions for the transistor 100. FIG. 4A depicts the transistor 100 at the same stage of fabrication as depicted in FIG. 1A with the sidewall spacer 26 added. That is, the basic gate structure 20, the liner layer 25, the extension implant regions 22A, and halo implant regions (not shown), and the sidewall spacer 26 have been formed.

Figure 4B:
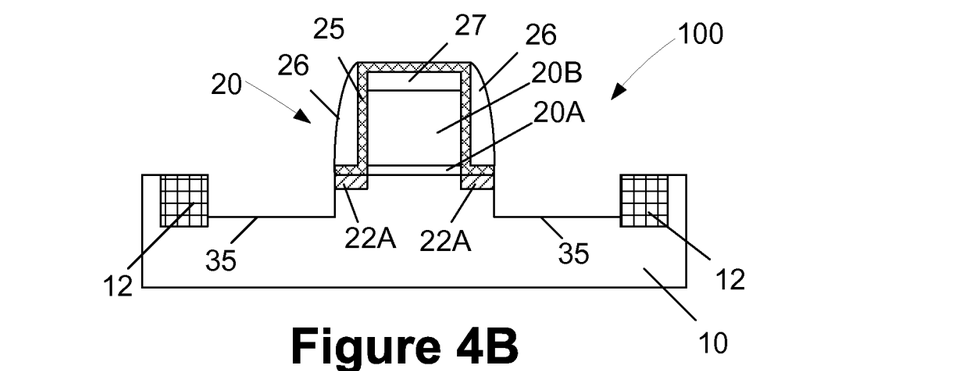

In FIG. 4B, one or more etching processes have been performed through a photo-resist mask (not shown) to form cavities 35 in the substrate 10 proximate the gate structure 20. The cavities 35 may be any desired shape or depth.

Figure 4C:
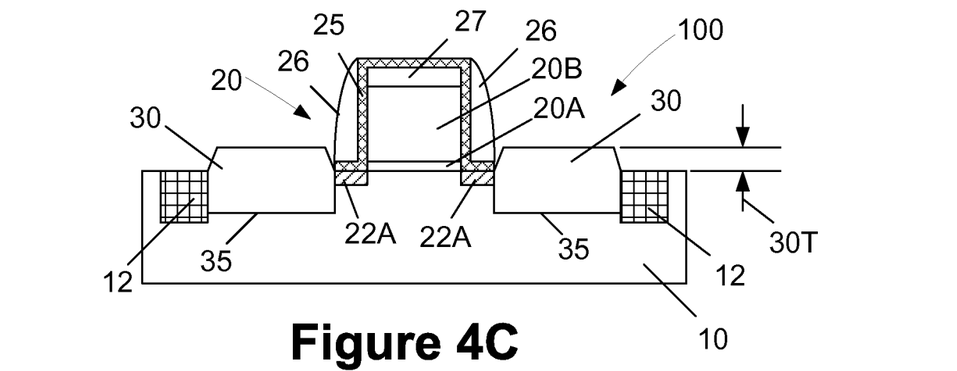

Next, as shown in FIG. 4C, an epitaxial deposition process is performed to grow a semiconductor material 30 in the cavities 35. The semiconductor material 30 may be either doped or undoped with an appropriate dopant material (N-type dopant for an NMOS transistor or a P-type dopant for a PMOS transistor). The desired dopant may be introduced into the semiconductor material 30 either in situ during the epitaxial deposition process, or they may be introduced by performing a subsequent ion implantation process. The semiconductor material 30 may be made of the same materials as previously described for the semiconductor materials 30D, 30U. This semiconductor material 30 (after dopants are introduced) will the final source/drain regions 50 (see FIG. 4G) of the transistor 100. Importantly, the semiconductor material is grown such that the upper portion of the semiconductor material, i.e., the portion extending above the surface 10S of the substrate 10, has a thickness 30T that is specifically selected to be at least as thick as the target thickness of the metal silicide region 34A (see FIG. 4G) that will be formed on final source/drain regions 50 (see FIG. 4G) for the transistor 100.

Figure 4D:
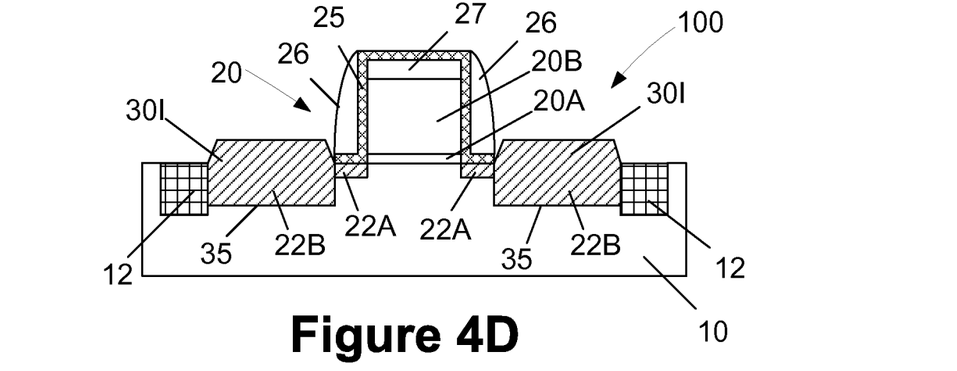

Next, in one illustrative embodiment where the semiconductor material 30 is initially formed in an undoped condition, as shown in FIG. 4D, an ion implantation process is performed to introduce the appropriate dopant (N-type dopant for an NMOS transistor or a P-type dopant for a PMOS transistor) into the semiconductor material 30 and to form source/drain implant regions 22B in the substrate 10. In FIG. 4D, shading has been added to reflect the doping (by implantation) of the previously undoped (in this example) semiconductor region 30 and a new reference number 301 has been added to reflect that an implant-doped semiconductor material 301 is now present on the transistor 100.

Figure 4E:
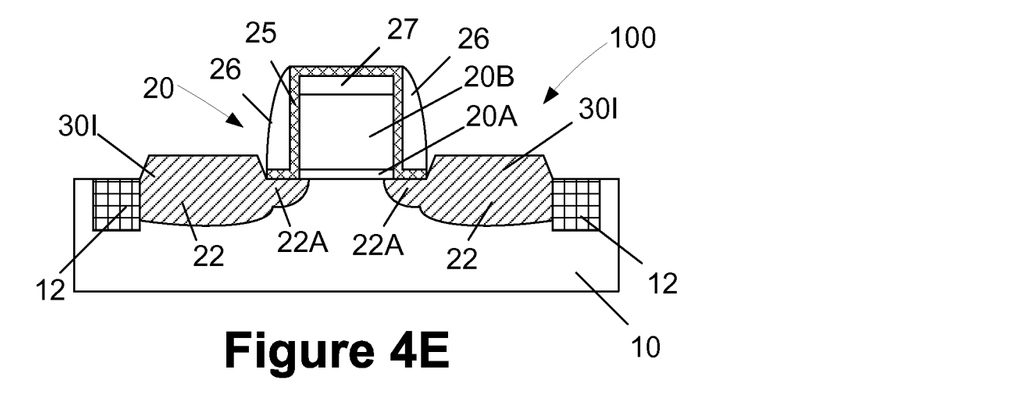
Figure 4F:
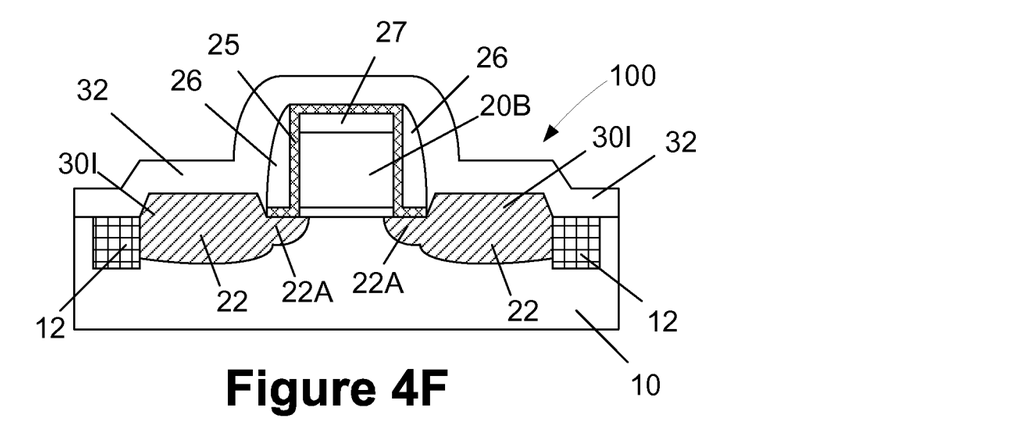

Then, as shown in FIG. 4E, an activation anneal process (e.g., a flash or laser anneal performed at about 1200° C. for about 1-2 ms) is performed to repair damage to the substrate 10 due to the various ion implantation processes and to activate the implanted dopant materials. Since the semiconductor material 30 was formed before the initial activation anneal process was performed to activate the implanted dopant materials, an additional activation anneal process is not required for this particular method. The final source/drain regions 50 of the transistor 100 depicted in FIG. 4E are shown after the anneal process has been performed and the extension implant regions 22A and the source/drain implant regions 22B have migrated from their as-implanted positions. Then, as shown in FIG. 4F, the previously described stress-inducing layer 32 is formed above the transistor 100 to induce the desired stress in the transistor 100. After the stress-inducing layer 32 is formed, a spike anneal process (e.g., 1000-1100° C. for a duration of about 2 seconds) is performed.

Figure 4G:
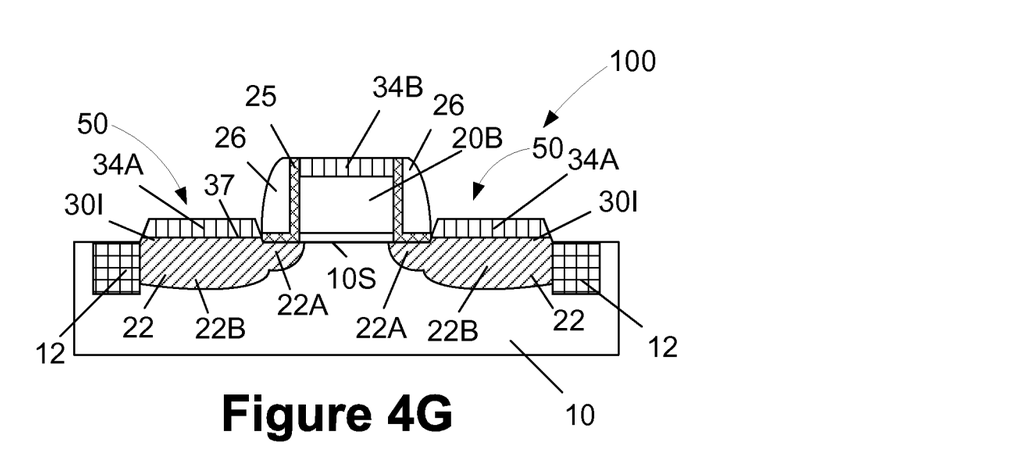

Next, as shown in FIG. 4G, the gate cap layer 27 has been removed and a silicidation process has been performed to form the metal silicide regions 34A on the final source/drain regions 50 of the transistor 100 and to form the metal silicide region 34 B on the gate electrode 20B. As shown in the depicted example, the metal silicide regions 34A consume less than the entirety of the illustrative implant-doped semiconductor material 301 that was formed on the substrate 10, as shown in FIGS. 4C-4D. Accordingly, by use of the present invention, the stressed material in the final source/drain regions 50 proximate the channel region of the transistor 100 is not consumed during the silicidation process performed to form the metal silicide regions 34A.

Note that in the illustrative examples described herein the bottom surface 37 of the metal silicide regions 34A (ignoring random downward spikes) is positioned above the surface 10S of the substrate 10. Such positioning of the metal silicide regions 34A helps to insure that there is no significant consumption of the stressed material in the final source/drain regions 50 proximate the channel region of the transistor 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metal silicide region on a source/drain region of a transistor, wherein said metal silicide region has a target thickness, the method comprising:

forming an upper portion of said source/drain region that is positioned above an uppermost surface of a semiconducting substrate, said upper portion of said source/drain region having an upper surface that is positioned above said uppermost surface of said substrate by a distance that is at least equal to said target thickness of said metal silicide region; and forming said metal silicide region in a portion of said upper portion of said source/drain region, wherein said metal silicide region has a bottom surface positioned above said uppermost surface of said substrate.

2. The method of claim 1, further comprising introducing a dopant material into said source/drain region.

3. The method of claim 1, Wherein forming said upper portion of said source/drain region above said uppermost surface of said semiconducting substrate comprises performing an epitaxial deposition process to form at least said upper portion of said source/drain region.

4. The method of claim 1, wherein forming said upper portion of said source/drain region above said uppermost surface of said semiconducting substrate comprises performing an epitaxial deposition process to form an undoped upper portion of said source/drain region.

5. The method of claim 4, further comprising performing an ion implantation process to introduce a dopant material into said undoped upper portion of said source/drain region.

6. The method of claim 1, wherein forming said upper portion of said source/drain region above said uppermost surface of said semiconducting substrate comprises performing an epitaxial deposition process to form a doped upper portion of said source/drain region.

7. A method of forming a metal silicide region on a source/drain region of a transistor, wherein said metal silicide region has a target thickness, the method comprising:
   forming an extension implant region and a source/drain implant region in a Semiconducting substrate proximate a gate structure of said transistor;
   after forming said extension implant region and said source/drain implant region, performing an epitaxial deposition process to form a semiconductor material positioned above said source/drain implant region and an uppermost surface of said semiconducting substrate, said semiconductor material having an upper surface that is positioned above said uppermost surface of said substrate by a distance that is at least equal to said target thickness of said metal silicide region; and
   forming said metal silicide region in a portion of said semiconductor material wherein said metal silicide region has a bottom surface positioned above said uppermost surface of said substrate.

8. The method of claim 7, wherein prior to performing said epitaxial deposition process, performing a first activation anneal process to activate dopant materials in said extension implant region and said source/drain implant region.

9. The method of claim 8, wherein performing said epitaxial deposition process to form .said semiconductor material comprises performing said epitaxial deposition Process while introducing a dopant material in situ to form a doped semiconductor material.

10. The method of claim 9, wherein after performing said epitaxial deposition process to form said semiconductor material, performing a second activation anneal process to reactivate dopant materials in at least said extension implant region and said source/drain implant region.

11. The method of claim 8, wherein, prior to forming said metal silicide region, forming a stress inducing layer of material on said semiconductor material.

12. A method of forming a metal silicide region on a source/drain region of a transistor, wherein said metal silicide region has a target thickness, the method comprising:
   forming an extension implant region and a source/drain implant region in a semiconducting substrate proximate a gate structure of said transistor;
   performing a first activation anneal process to activate dopant materials in said extension implant region and said source/drain implant region;
   after performing said first activation anneal process, performing an epitaxial deposition process to form a doped semiconductor material positioned above said source/drain implant region and an uppermost surface of said semiconducting substrate, said semiconductor material having an upper surface that is positioned above said uppermost surface of said substrate by a distance that is at least equal to said target thickness of said metal silicide region; and
   forming said metal silicide region in a portion of said doped semiconductor material wherein said metal silicide region has a bottom surface positioned above said uppermost surface of said substrate.

13. The method of claim 12, wherein, prior to forming said doped semiconductor material, forming a stress inducing layer of material on said surface of said substrate.

14. The method of claim 12, wherein after performing said epitaxial deposition process to form said doped semiconductor material, performing a second activation anneal process to reactivate dopant materials in at least said extension implant region and said source/drain implant region.

15. A method of forming a metal silicide region on a source/drain region of a transistor, wherein said metal silicide region has a target thickness, the method comprising:
   forming an extension implant region in a semiconducting substrate proximate a gate structure of said transistor;
   after forming said extension implant region, forming a cavity in said substrate proximate . said gate structure of said transistor;
   performing an epitaxial deposition process to form an undoped Semiconductor material in said cavity, said undoped semiconductor material having an upper surface that is positioned above said an uppermost surface of said substrate by a distance that is at least equal to said target thickness of said metal silicide region;
   performing an ion implantation process to introduce a dopant material into said semiconductor material and to form a source/drain implant region;
   after performing said ion implantation process, performing an activation anneal process to activate dopant materials in at least said extension implant region and said source/drain implant region; and
   after performing said activation anneal process, forming said metal silicide region in a portion of said semiconductor material such that a bottom surface of said metal silicide re ion is positioned above said upper surface of said semiconductor material and the uppermost surface of said semiconductor material is positioned above said uppermost surface of said substrate.

16. The method of claim 15, wherein, after performing said ion implantation process, but prior to forming said metal silicide region, forming a stress inducing layer of material on said semiconductor material.

* * * * *

UNITED STATES PATENT AND TRADEMARK OFFICE
CERTIFICATE OF CORRECTION

PATENT NO. : 9,490,344 B2  
APPLICATION NO. : 13/345922  
DATED : November 8, 2016  
INVENTOR(S) : Stefan Flachowsky et al.

Page 1 of 1

It is certified that error appears in the above-identified patent and that said Letters Patent is hereby corrected as shown below:

In the Claims

Column 11, Line 5 (Claim 3, Line 1), delete "Wherein" and insert therefor -- wherein --.

Column 11, Line 27 (Claim 7, Line 5), delete "Semiconducting" and insert therefor -- semiconducting --.

Column 11, Line 50 (Claim 9, Line 4), delete "Process" and insert therefor -- process --.

Column 12, Line 36 (Claim 15, Line 7), delete "proximate . said" and insert therefor -- proximate said --.

Column 12, Line 39 (Claim 15, Line 10), delete "Semiconductor" and insert therefor -- semiconductor --.

Column 12, Line 41 (Claim 15, Line 12), delete "said an" and insert therefor -- an --.

Column 12, Line 54 (Claim 15, Line 25), delete "re ion" and insert therefor -- region --.

Column 12, Line 55 (Claim 15, Line 26), delete "uppermost" and insert therefor -- upper --.

Signed and Sealed this  
Twenty-seventh Day of December, 2016

Michelle K. Lee  
*Director of the United States Patent and Trademark Office*